US007215178B2

(12) United States Patent
Kushida et al.

(10) Patent No.: US 7,215,178 B2
(45) Date of Patent: May 8, 2007

(54) MOS TYPE SEMICONDUCTOR INTEGRATED CIRCUIT DEVICE

(75) Inventors: Keiichi Kushida, Yokohama (JP); Osamu Hirabayashi, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 17 days.

(21) Appl. No.: 11/251,824

(22) Filed: Oct. 18, 2005

(65) Prior Publication Data

US 2006/0132227 A1  Jun. 22, 2006

(51) Int. Cl.
*G05F 1/10* (2006.01)
(52) U.S. Cl. ..................................... 327/534
(58) Field of Classification Search ............... 327/530, 327/534, 535
See application file for complete search history.

(56) References Cited

U.S. PATENT DOCUMENTS

| | | | | |
|---|---|---|---|---|
| 6,049,245 | A * | 4/2000 | Son et al. | 327/544 |
| 6,118,328 | A * | 9/2000 | Morikawa | 327/534 |
| 6,552,596 | B2 * | 4/2003 | Cowles et al. | 327/318 |
| 6,759,873 | B2 * | 7/2004 | Kang et al. | 326/81 |
| 2006/0133177 | A1 | 6/2006 | Kushida et al. | |

FOREIGN PATENT DOCUMENTS

JP    2002-64150    2/2002

OTHER PUBLICATIONS

Koji Nii, et al. "A 90 nm Low Power 32K-Byte Embedded SRAM with Gate Leakage Suppression Circuit for Mobile Applications", 2003 Symposium on VLSI Circuits Digest of Technical Papers, pp. 247-250.
Kenichi Osada, et al. "16.7fA/cell Tunnel-Leakage-Suppressed 16Mb SRAM for Handling Cosmic-Ray-Induced Multi-Errors", 2003 IEEE International Solid-State Circuits Conference, 10 Pages.

* cited by examiner

*Primary Examiner*—Jeffrey Zweizig
(74) *Attorney, Agent, or Firm*—Oblon, Spivak, McClelland, Maier & Neustadt, P.C.

(57) ABSTRACT

A plurality of MOS type circuits is provided, and are connected in a multistage manner. A first transistor is inserted between a power source voltage VDD and a power supply node of each of MOS type circuits at an odd numbered stage. A second transistor is inserted between the power source voltage VDD and a power supply node of each of MOS type circuits at an even numbered stage. When the plurality of MOS type circuits are established in a standby state, a control circuit first controls to make a second transistor conductive, and then make a first transistor conductive when the plurality of MOS type circuits, each of which is established in a standby state, are recovered from the standby state to an active state.

19 Claims, 5 Drawing Sheets

MOS TYPE SEMICONDUCTOR INTEGRATED CIRCUIT DEVICE

CROSS-REFERENCE TO RELATED APPLICATIONS

This application is based upon and claims the benefit of priority from prior Japanese Patent Application No. 2004-368209, filed Dec. 20, 2004, the entire contents of which are incorporated herein by reference.

BACKGROUND OF THE INVENTION

1. Field of the Invention

The present invention relates to a MOS type semiconductor integrated circuit device which achieves low power consumption by shutting down power supplied to a circuit while in a standby mode.

2. Description of the Related Art

Recently, in the semiconductor industry, with the growth of the market for a portable electronic device, there has been a demand for a semiconductor integrated circuit device intended to achieve low power consumption. The factors which determine power consumption of a semiconductor integrated circuit device may include: current consumption while in an active mode, i.e., during operation; and a leak current while in a standby mode being a cycle during which no operation is required. In addition, the leak current while in the standby mode in a semiconductor element such as a MOS transistor includes an off-leak current and a gate leak current.

Figure 1:
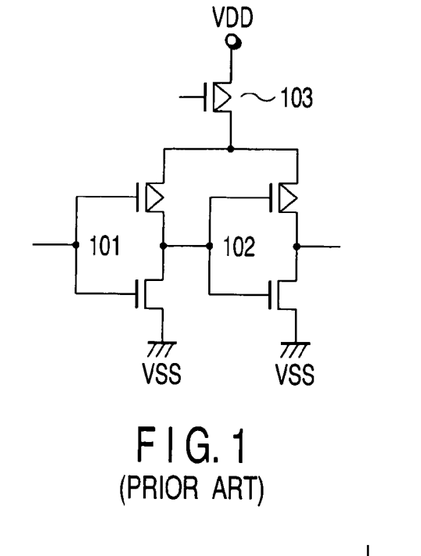
FIG. 1 is a circuit diagram depicting a conventional semiconductor integrated circuit device.

FIG. 1 shows a configuration of a part of a conventional semiconductor integrated circuit device intended to achieve low power consumption. This circuit has: two CMOS inverter circuits 101 and 102 connected in series; and a switching P-channel MOS transistor 103 connected between a supply node of a power source voltage VDD and a common source at a P-channel MOS transistor side of the two CMOS inverter circuits 101 and 102. The switching transistor 103 is turned on while in an active mode, and is turned off while in a standby mode.

In the circuit of FIG. 1, the transistor 103 is turned off while in a standby mode, and power of the whole circuit is shut off, so that the off-leak current or gate leak current as described above are significantly reduced.

However, when the standby mode is switched to normal operation or vice versa, an unwanted penetration current flows between power supplies. In addition, the electric potential of each node becomes insufficient while in the standby mode, and thus, there is a danger that a malfunction occurs.

Figure 2:
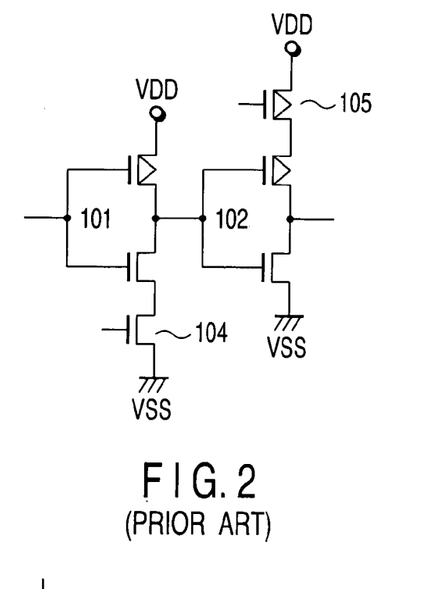
FIG. 2 is a circuit diagram depicting a conventional semiconductor integrated circuit device.

FIG. 2 shows a configuration of a part of another conventional semiconductor integrated circuit device intended to achieve low power consumption. This circuit has: two CMOS inverter circuits 101 and 102 connected in series; a switching N-channel MOS transistor 104 connected between a source at an N-channel MOS transistor side of one CMOS inverter circuit 101, and a supply node of a grounding voltage VSS; and a switching P-channel MOS transistor 105 connected to a source at a P-channel MOS transistor side of the other CMOS inverter circuit 102 and a supply node of a power source voltage VDD. The switching transistors 104 and 105 are turned on while in an active mode, and are turned off while in a standby mode.

In the circuit of FIG. 2, the transistors 104 and 105 are turned off while in a standby mode, and power source voltage of the whole circuit is shut off, so that reduction of the off-leak current as described above is achieved. Further, an occurrence of a malfunction caused by the shortage of an electric potential of each node can be prevented.

However, the power source voltage VDD is always supplied to the CMOS inverter circuit 101, so that a gate leak current flows while in a standby mode. That is, in the circuit of FIG. 2, reduction of the gate leak current while in the standby mode cannot be achieved.

In documents entitled "A 90 nm Low Power 32 K-Byte Embedded SRAM with Gate Leakage Suppression Circuit for Mobile Application", 2003 Symposium on VLSI Circuits Digest of Technical Papers, pp. 247–250 (FIG. 4) and "16.7 fA/cell Tunnel-Leakage-Suppressed 16 Mb SRAM for Handling Cosmic-Ray-Induced Multi-Errors", 2003 IEEE International Solid-State Circuits Conference (ISSCC 2003/Feb. 12, 2003/Salon 1-6/9:00 AM), respectively, a SRAM is described which is intended to reduce a leak current by reducing a value of a power source voltage while in a standby mode.

BRIEF SUMMARY OF THE INVENTION

According to one aspect of the present invention, there is provided a MOS type semiconductor integrated circuit device, comprising: a plurality of MOS type circuits, each of which has at least one P-channel MOS transistor and one N-channel MOS transistor and has a power supply node, the MOS type circuits being connected in a multistage manner that an output signal at a front stage is supplied as an input signal at a rear stage; a first switch element inserted between a first power voltage node and a power supply node of each of MOS type circuits at an odd numbered stage viewed from a final stage from among said plurality of MOS type circuits; a second switch element inserted between the first power voltage node and a power supply node of each of MOS type circuits at an even numbered stage viewed from the final stage from among said plurality of MOS type circuits; and a control circuit connected to the first and second switch elements to control the first and second switch elements, the control circuit first making the second switch element conductive, and then, making the first switch element conductive when said plurality of MOS type circuits, each of which is established in a standby state, are recovered from the standby state to an active state.

DETAILED DESCRIPTION OF THE INVENTION

Hereinafter, embodiments of the present invention will be described with reference to the accompanying drawings.

(First Embodiment)

Figure 3:
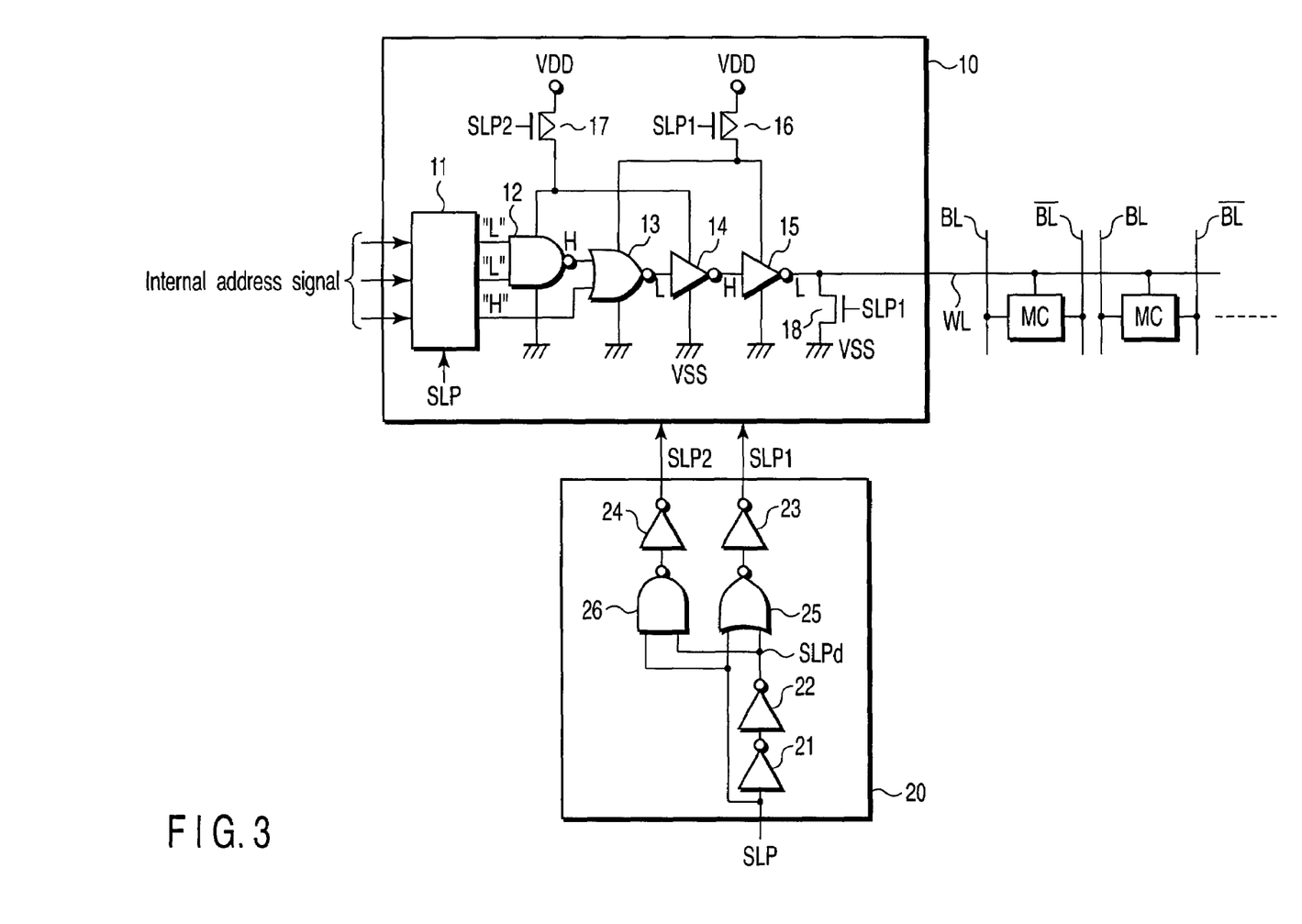
FIG. 3 is a circuit diagram depicting a static random access memory according to a first embodiment.

FIG. 3 shows a circuit configuration of a static random access memory (SRAM) according to a first embodiment. Reference numeral 10 denotes a word line drive circuit (hereinafter, referred to as a row decoder). A word line WL is connected to the row decoder 10. A plurality of memory cells MC composed of static cells, each of which is selected by a signal of the word line WL, are connected to the word line WL. A pair of bit lines BL and /BL, to which data read out from the selected memory cell and write data supplied to the selected memory cell are transmitted, are connected to the memory cells MC, respectively.

The row decoder 10 decodes an internal address signal, and drives the word line WL. The row decoder 10 includes: an input control circuit 11; and a plurality of CMOS type circuits which decode internal address signals of a plurality of bits outputted from the input control circuit 11. The present embodiment includes a plurality of CMOS type circuits, i.e., a 2-input NAND gate circuit 12; a 2-input NOR gate circuit 13, and two inverter circuits 14 and 15, which are composed of a P-channel MOS transistor and an N-channel MOS transistor, respectively.

The input control circuit 11 outputs a signal according to input address signals of a plurality of bits (3 bits in the present embodiment) to be supplied while in an active mode, and uniquely sets a logic level of a 3-bit output signal such that the word line WL is driven at a level "L" regardless of the internal address signal while in a standby mode.

The plurality of CMOS type circuits in the row decoder 10 are connected in a multi-stepped manner such that an output signal at a front stage is supplied as an input signal to a rear stage. That is, 2-bit signals are supplied to the NAND gate circuit 12 from among 3-bit signals outputted from the input control circuit 11. An output signal of the NAND gate circuit 12 and the remaining 1-bit signal of the 3-bit signals outputted from the input control circuit 11 are supplied to the NOR gate circuit 13. An output signal of the NOR gate circuit 13 is supplied to the inverter circuit 14. An output signal of the inverter circuit 14 is supplied to the inverter circuit 15. Then, an output node of the inverter circuit 15 is connected to the word line WL. Since an output signal of the inverter circuit 15 directly drives the word line WL, it is necessary to supply to the inverter circuit 15 a current which is greater in magnitude as compared with that to be supplied to the inverter circuit 14.

Figure 4:
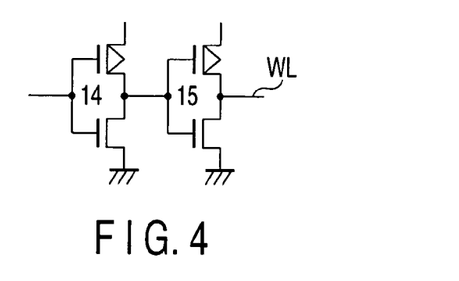
FIG. 4 is a circuit diagram depicting an example of a specific configuration of an inverter circuit shown in FIG. 3.

FIG. 4 shows an example of a specific circuit configuration of the inverter circuits 14 and 15 shown in FIG. 3. Each of the inverter circuits 14 and 15 includes one P-channel MOS transistor and one N-channel MOS transistor. In order to supply to the inverter circuit 15 a current which is greater in magnitude as compared with that to be supplied to the inverter circuit 14, the element size at least at the P-channel side of the P-channel and N-channel MOS transistors at the side of the inverter circuit 15 is increased more significantly than that at the side of the inverter circuit 14. Of course, with respect to the element size at the N-channel side, the size at the side of the inverter circuit 15 may be increased more significantly than that at the side of the inverter circuit 14.

Of a plurality of CMOS type circuits provided in the row decoder 10, a source to drain of the P-channel MOS transistor 16 is inserted between a power supply node of each of the inverter circuit 15 and the NOR gate circuit 13 corresponding to an odd numbered stage viewed from the final stage, namely, a source at the P-channel MOS transistor side in each gate circuit and a supply node of a power source voltage VDD.

In addition, a source to drain of the P-channel MOS transistor 17 is inserted between a power supply node of each of the inverter circuit 14 and the NAND gate circuit 12 corresponding to an even numbered stage viewed from the final stage, namely, a source at the P-channel MOS transistor side in each gate circuit and a supply node of the power source voltage VDD.

Further, a source to drain of an N-channel MOS transistor 18 for noise elimination is inserted at the final stage, i.e., between the output node of the inverter circuit 15 and a supply node of a grounding voltage VSS.

A control signal SLP1 is supplied to each of the gate electrodes of the transistors 16 and 18, and a control signal SLP2 is supplied to the gate electrode of the transistor 17.

A control circuit 20 generates the control signals SLP1 and SLP2 in response to a sleep control signal SLP. For example, this control circuit includes four inverter circuits 21 to 24, a 2-input NOR gate circuit 25, and a 2-input NAND gate circuit 26. An operation of the input control circuit 11 is also controlled in response to the sleep control signal SLP.

The sleep control signal SLP is supplied to one input node of each of the NOR gate circuit 25 and NAND gate circuit 26 contained in the control circuit 20. In addition, the sleep control signal SLP is supplied to the other input node of each of the NOR gate circuit 25 and NAND gate circuit 26 via two inverter circuits 21 and 22 connected in series. An output signal of the NOR gate circuit 25 is supplied to the inverter circuit 23, and the control signal SLP1 is outputted from an output node of the inverter circuit 23. An output signal of the NAND gate circuit 26 is supplied to the inverter circuit 24, and the control signal SLP2 is outputted from an output node of the inverter circuit 24.

Figure 5:
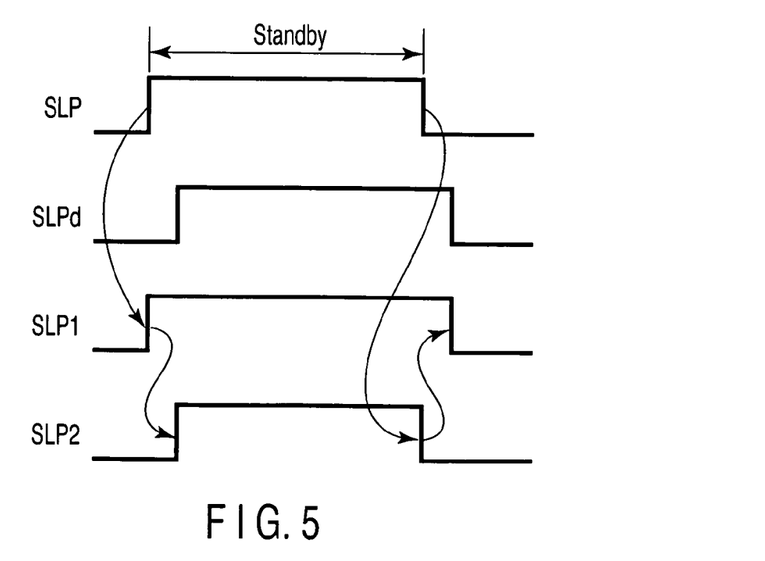
FIG. 5 is a timing chart showing an example of an operation of the static random access memory shown in FIG. 3.

Now, an operation of a SRAM configured as above will be described with reference to a timing chart shown in FIG. 5.

While in an active mode, the sleep control signal SLP is set at a level "L". When the sleep control signal SLP is set at the level "L", an output signal of the inverter circuit 22 is set at the level "L" in the control circuit 20. Thus, an output signal of the NOR gate circuit 25 is set at a level "H", and an output signal of the inverter circuit 23, namely, the control signal SLP1 is set at the level "L". In addition, an output signal of the NAND gate circuit 26 is set at the level "H", and an output signal of the inverter circuit 24, namely, the control signal SLP2 is set at the level "L".

At this time, in the row decoder 10, the transistors 16 and 17 are turned on. Then, the power source voltage VDD is supplied to the NOR gate circuit 13 and the inverter circuit 15 via one transistor 16, and the power source voltage VDD is supplied to the NAND gate circuit 12 and the inverter circuit 14 via the other transistor 17. The transistor 18 is turned off. Then, a 3-bit signal outputted from the input control circuit 11 is decoded by the row decoder 10, and the word line WL is driven in response to the decoding signal.

While in a standby mode, the sleep control signal SLP is set at a level "H". When the sleep control signal SLP is set at the level "H", an output signal of the inverter circuit 22 is set at a level "H" in the control circuit 20. Thus, the output signal of the NOR gate circuit 25 is set at the level "L", and the output signal of the inverter circuit 23, namely, the control signal SLP1 is set at the level "H". In addition, the output signal of the NAND gate circuit 26 is set at the level "L", and the output signal of the inverter circuit 24, namely, the control signal SPL2 is set at the level "H".

At this time, in the row decoder 10, the transistors 16 and 17 are turned off, and power source voltage supplies to all the CMOS type circuits contained in the row decoder 10 are shut off. The transistor 18 is turned on, and the word line WL is fixed to the level "L". In this state, power source voltage of the raw decoder 10 is shut off, and thus, an off-leak current and a gate leak current hardly flow through all the CMOS type circuits contained in the row decoder 10. A gate leak current flows through the transistor 18. However, the transistor 18 is intended for noise elimination, so that the transistor size can be sufficiently reduced as compared with any other transistor contained in the row decoder 10, and thus, the gate leak current value can be ignored in size. In this manner, the off-leak current and the gate leak current while in the standby mode can be reduced.

While in the standby mode, the input control circuit 11 sets a logic level of a 3-bit output signal such that an output signal of the row decoder 10 is uniquely set at the level "L". This is because the memory cell MC connected to the word line WL enters a unselected state when a signal of the word line WL is set at the level "L", and while in the standby mode including a mode change, the signal of the word line WL must be set at the level "L", i.e., at a VSS potential. For example, in the case where the row decoder 10 is configured as shown in FIG. 3, the input control circuit 11 sets logic levels of the 3-bit signals at the levels "L", "L", and "H", respectively, as shown in FIG. 3. In this manner, the output signal of the NAND gate circuit 12 is set at the level "H", the output signal of the NOR gate circuit 13 is set at the level "L" level, the output signal of the inverter circuit 14 is set at the level "H" level, and the output signal of the inverter circuit 15 is set at the level "L", so that the signal of the word line WL does not rise to the "H" level. Since, power source voltage of each CMOS type circuit is shut off while in the standby mode, a logic level of the output signal of each CMOS type circuit is achieved by a charge accumulated on a parasitic capacity which exists in each node.

Now, an operation for changing the active state to the standby mode will be described here. When the standby mode is established, the sleep control signal SLP is increased from the level "L" to the level "H". Thereafter, the output signal of the NOR gate circuit 25 is set at the level "L" immediately, and the control signal SLP1 is set at the level "H". Consequently, in the row decoder 10, the transistor 16 is turned off, and the power source voltage VDD supplied to the NOR gate circuit 13 and the inverter circuit 15 is shut off. At this time, the transistor 17 is turned on, power source voltage is supplied to the inverter circuit 14 at the front stage of the inverter circuit 15, and its output signal is set at the level "H" by means of the signal from the input control circuit 11. Thus, power supply to the inverter circuit 15 at the final stage in which there is a possibility that the greatest penetration current flows, is shut off, and no penetration current flows through the inverter circuit 15. When the control signal SLP1 is set at the level "H", the transistor 18 is turned on, and the word line WL is set at the level "L".

Therefore, even if the transistor 16 is turned off, no noise is generated in the word line WL. That is, a malfunction caused by noise can be prevented.

When the transistor 16 is fully turned off after the standby mode has been established, an output signal SPLd of the inverter circuit 22 changes from the level "L" to the level "H". Then, the output signal of the NAND gate circuit 25 is set at the level "L", and the control signal SLP2 is set at the level "H". Consequently, in the row decoder 10, the transistor 17 is turned off, and the power source voltage VDD supplied to the NAND gate circuit 12 and the inverter circuit 14 is shut off. At this time, a power source voltage is not supplied to the inverter circuit 15 any more, and the transistor 18 is turned on. Thus, no noise is generated in the word line WL. That is, in this case also, a malfunction caused by noise can be prevented.

When the active state is recovered from the standby mode, the sleep control signal SLP is lowered from the level "H" to the level "L". Then, the output signal of the NAND gate circuit 26 is set at the level "H" immediately, and the control signal SLP2 is set at the level "L". In this manner, in the row decoder 10, the transistor 17 is turned on, and the power source voltage VDD is restarted to be supplied to the NAND gate circuit 12 and the inverter circuit 14. Since at this time, the output signal SLPd of the inverter circuit 22 is still set at the level "H", the output signal of the NOR gate circuit 25 is set at the level "L", and the control signal SLP1 is set at the level "H". Therefore, the transistor 16 is turned off, and no power source voltage is supplied to the inverter circuit 15 at the final stage. Therefore, even if the power source voltage VDD is restarted to be supplied to the NAND gate circuit 12 and the inverter circuit 14, no penetration current flows through the inverter circuit 15.

Thereafter, the output signal SLPd of the inverter circuit 22 changes from the level "H" to the level "L". Then, the output signal of the NOR gate circuit 25 is set at the level "H", and the control signal SLP1 is set at the level "L". Consequently, in the row decoder 10, the transistor 16 is turned on, and the power source voltage VDD is restarted to be supplied to the NOR gate circuit 13 and the inverter circuit 15. At this time, the logic level of the output signal of the inverter circuit 14 at the front stage of the inverter circuit 15 is already established, and thus, no penetration current flows through the inverter circuit 15.

Thus, when the active state is changed to the standby mode or vice versa, no penetration current flows through the inverter circuit 15 at the final stage through which the greatest current flows.

As described above, in the SRAM according to the embodiment, an occurrence of a penetration current or a malfunction can be prevented, and the off-leak current and the gate leak current can be reduced.

(Modified Example of First Embodiment)

Figure 6:
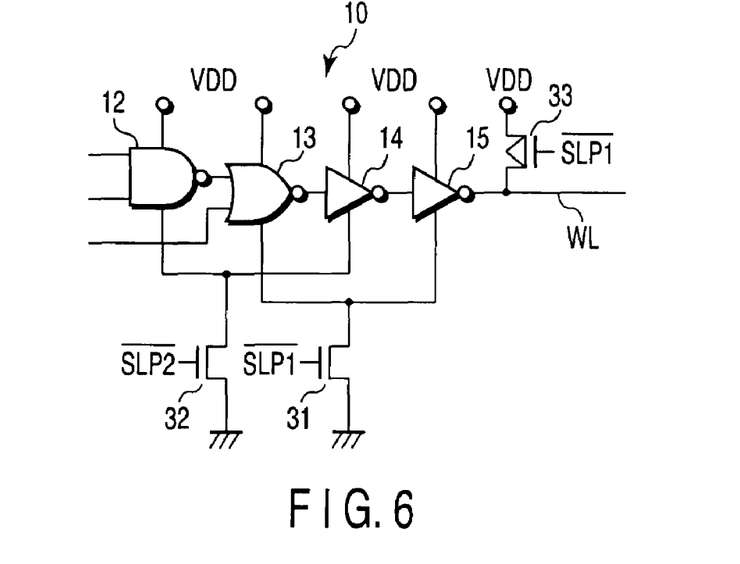
FIG. 6 is a circuit diagram depicting a row decoder according to a modified example of the first embodiment.

FIG. 6 shows a configuration of a row decoder 10 according to a modified example of the first embodiment. In this modified example, unlike the case of FIG. 3, a memory cell MC connected to a word line WL is selected when a signal of the word line WL is set at a level "L". Concurrently, in the row decoder 10 shown in FIG. 6, a "L" level signal is outputted when the word line WL is driven, and an "H" level signal is outputted when the word line is inactive.

In the row decoder 10 shown in FIG. 3, the P-channel MOS transistors 16 and 17 are provided as switches which control supply/shutoff of power supply voltage to each of a plurality of CMOS type circuits. In contrast, in the row decoder shown in FIG. 6, N-channel MOS transistors 31 and 32 are provided as switches which corresponds to the above P-channel MOS transistors 16 and 17.

A source to drain of one transistor 31 is inserted between a power supply node at the ground voltage side of each of the inverter circuit 15 and NOR gate circuit 13 corresponding to the odd numbered stages viewed from the final state, namely, a source at the N-channel MOS transistor side in each CMOS type circuit and a supply node of a grounding voltage VSS.

In addition, the source to drain of the other transistor 32 is inserted between a power supply node at the grounding voltage side of each of the inverter circuit 14 and NAND gate circuit 12 corresponding to the even numbered stages viewed from the final stage, namely, a source at the N-channel MOS transistor side contained in each gate circuit and a supply node of the grounding voltage VSS.

In this case, an inverting signal /SLP1 of the control signal SLP1 is supplied to a gate electrode of the transistor 31, and an inverting signal /SLP2 of the control signal SLP2 is supplied to a gate electrode of the transistor 32.

Further, unlike the case of FIG. 3, a source to drain of the P-channel MOS transistor 33 for noise elimination is inserted between an output node of the inverter circuit 15 and a supply node of the power source voltage VDD.

In the SRAM according to the modified example also, advantageous effect similar to that of the SRAM according to the embodiment shown in FIG. 3 can be attained.

(Second Embodiment)

Figure 7:
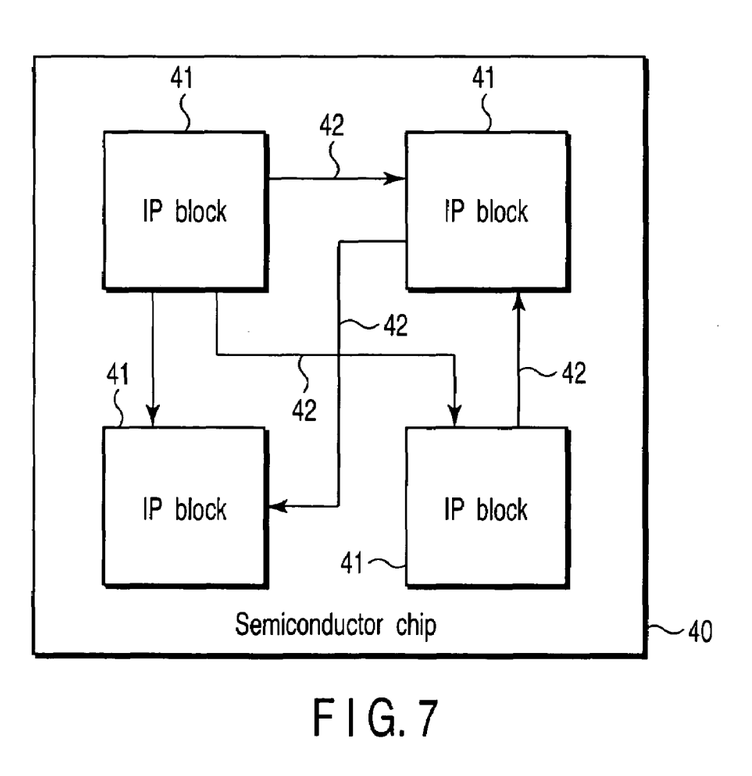
FIG. 7 is a block diagram depicting a semiconductor integrated circuit device according to a second embodiment.

FIG. 7 is a block diagram depicting a semiconductor integrated circuit device according to a second embodiment. In this semiconductor integrated circuit device, a plurality of intellectual property (IP) blocks 41 is formed in a semiconductor chip 40. The IP block used here denotes a circuit having a predetermined function which has been prepared in advance. FIG. 7 illustrates a case in which four IP blocks 41 are formed in the semiconductor chip 40. In addition, internal wires 42 connecting the four IP blocks 41 are formed in the semiconductor chip 40. A wire for inputting and outputting a signal to and from an outside of the chip is not shown in the figure.

In each of the four IP blocks 41, an interface circuit which outputs a signal contained in the corresponding IP block to the internal wire 42 and a control circuit which controls an operation of the interface circuit are provided, respectively.

Figure 8:
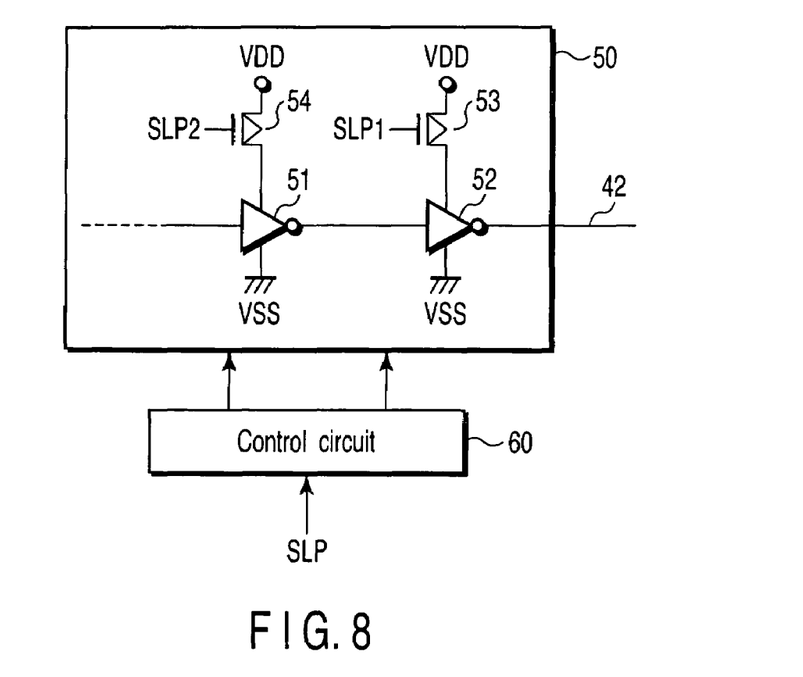
FIG. 8 is a circuit diagram showing an example of an interface circuit and a control circuit provided in the semiconductor integrated circuit device of FIG. 7.

FIG. 8 shows an example of an interface circuit 50 and a control circuit 60 provided in each IP block 41. The interface circuit 50 includes an inverter circuit 51 serving as a pre-buffer to which a signal generated in the IP block 41 is to be inputted, and an inverter circuit 52 serving as a main buffer to which an output signal of the inverter circuit 51 is inputted and from which a signal is outputted to the internal wire 42. An output bode of the inverter circuit 52 is connected to the internal wire 42. Both of the inverter circuits 51 and 52 are CMOS type circuits, each of which is composed of a P-channel MOS transistor and an N-channel MOS transistor.

Since the output signal of the inverter circuit 52 directly drives the internal wire 42, it is necessary to supply a greater current to the inverter circuit 52 as compared with the inverter circuit 51. Therefore, as is the case with the inverter circuits 14 and 15 shown in FIG. 3, the element size of at least the P-channel side from among the both of the P-channel and N-channel MOS transistors contained-in the inverter circuits 51 and 52 is greater at the side of the inverter circuit 52 than that at the side of the inverter circuit 51. Of course, with respect to the element size of the N-channel size as well, the size at the side of the inverter circuit 52 may be greater than that at the side of the inverter circuit 51.

A source to drain of a P-channel MOS transistor 53 is inserted between a power supply node of the inverter circuit 52, namely, a source at the P-channel MOS transistor side in the inverter circuit and a supply node of a power source voltage VDD. In addition, a source to drain of a P-channel MOS transistor 54 is inserted between a power supply node of the inverter circuit 51, namely, a source at the P-channel MOS transistor side in the inverter circuit and a supply node of the power source voltage VDD. A control signal SLP1 is supplied to each gate electrode of the transistor 53, and a control signal SLP2 is supplied to a gate electrode of the transistor 54.

The control circuit 60 generates the control signals SLP1 and SLP2 in response to a sleep control signal SLP, and has a circuit configuration similar to the control circuit 20 shown in FIG. 3, for example.

Now, an operation of the semiconductor integrated circuit device constructed above will be described here.

While in an active mode, the sleep control signal SLP is set at a level "L". When the sleep control signal SLP is set at the level "L", the control signals SLP1 and SLP2 are set at the level "L" as is the case with FIG. 3.

At this time, in the interface circuit 50, the transistors 53 and 54 are turned on, and the power source voltage VDD is supplied to the inverter circuits 52 and 51. Then, a signal generated in the IP block 41 is outputted to the internal wire 42 via the two inverter circuits 52 and 51.

While in a standby mode, the sleep control signal SLP is set at a level "H". When the sleep control signal is set at the level "H", the control signals SLP1 and SLP2 are set at the level "H", as is the case with FIG. 3.

At this time, in the interface circuit 50, the transistors 53 and 54 are turned off, and power source voltage to the inverter circuits 52 and 51 is shut off. In this state, the power source voltage to the inverter circuits 52 and 52 is shut off, so that an off-leak current and a gate leak current hardly flow through the inverter circuits 52 and 51. In this manner, the off-leak current and gate leak current while in the standby mode can be reduced.

Now, an operation for changing the active state to the standby mode will be described here. When the standby mode is established, the sleep control signal SLP is increased from the level "L" to the level "H". As is the case with FIG. 3, the control signal SLP1 is then set at the level "H". When the control signal SLP1 is set at the level "H", the transistor 53 is turned off, and the power source voltage VDD supplied to the inverter circuit 52 at the final stage is shut off in the interface circuit 50. At this time, the transistor 54 is turned on, and power source voltage is supplied to the inverter circuit 51 at the front stage of the inverter circuit 52. Therefore, even if power source voltage to the inverter circuit 52 at the final stage at which there is a possibility that the greatest penetration current flows is shut off, no penetration current flows through the inverter circuit 52.

When the transistor 53 is fully turned off after the standby mode has been established, the control signal SLP2 is set at the level "H" as is the case with FIG. 3. Consequently, in the interface circuit 50, the transistor 54 is turned off, and the power source voltage VDD supplied to the inverter circuit 51 is shut off. At this time, since a power source voltage is not supplied to the inverter circuit 52 at the final stage any more, no noise is generated in the internal wire 42. That is, a malfunction caused by noise can be prevented.

When the active state is recovered from the standby mode, the sleep control signal SLP is lowered from the level "H" to the level "L". At this time, the control signal SLP2 is set at the level "L" as is the case with FIG. 3. In this manner, in the interface circuit 50, the transistor 54 is turned on, and the power source voltage VDD is restarted to be supplied to the inverter circuit 51. At this time, no power source voltage is supplied to the inverter circuit 52 at the final stage, and thus, no penetration current flows through the inverter circuit 52.

Thereafter, as is the case with FIG. 3, the control signal SLP1 is set at the level "L". Consequently, in the interface circuit 50, the transistor 53 is turned on, and the power source voltage VDD is restarted to be supplied to the inverter circuit 52 at the final stage. At this time, since a logic level of an output signal of the inverter circuit 51 at the front stage of the inverter circuit 52 is already established, no penetration current flows through the inverter circuit 52.

Thus, when the standby mode is switched from the active stage or vice versa, no penetration current flows through the inverter circuit 52 at the final stage at which the greatest current flows.

As described above, in the semiconductor integrated circuit device according to the second embodiment, an occurrence of a penetration current or a malfunction can be prevented, and an off-leak current and a gate leak current can be reduced.

(Modified Example of Second Embodiment)

Figure 9:
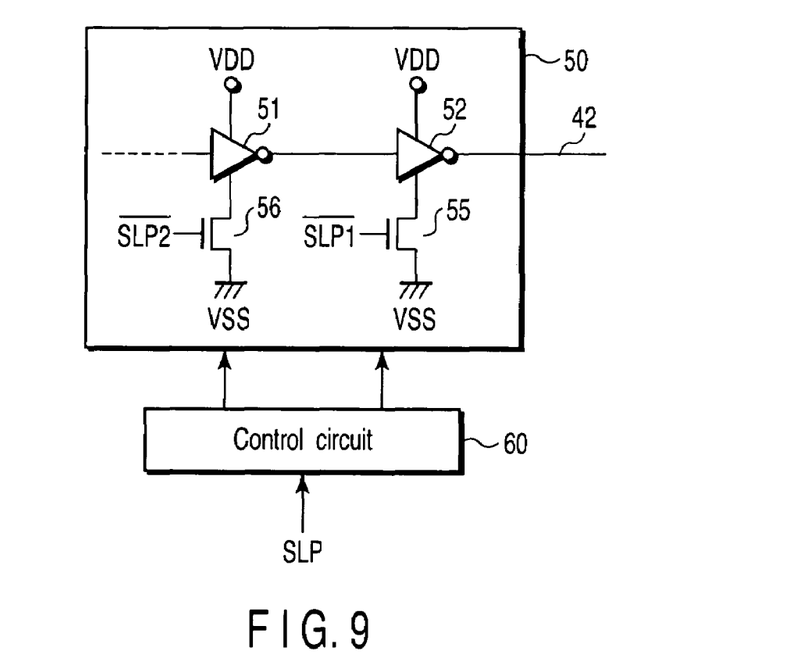
FIG. 9 is a circuit diagram depicting a semiconductor integrated circuit device according to a modified example of the second embodiment.

FIG. 9 shows a configuration of an interface circuit 50 and a control circuit 60 of a semiconductor integrated circuit device according to a modified example of the second embodiment. In the interference circuit 50 shown in FIG. 8, P-channel MOS transistors 53 and 54 are provided as switches which control supply/shutoff of power source voltage to two inverter circuits 52 and 51. In contrast, in the interface circuit 50 shown in FIG. 9, N-channel MOS transistors 55 and 56 are provided as switches which correspond to the P-channel MOS transistors 53 and 54.

That is, a source to drain of one transistor 56 is inserted between a power supply node at the grounding voltage side of the inverter circuit 52, namely, a source at the N-channel MOS transistor side in the inverter circuit, and a supply node of a grounding voltage VSS. A source to drain of the other transistor 56 is inserted between a power supply node at the grounding voltage side of the inverter circuit 51, namely, a source at the N-channel MOS transistor side in the inverter circuit and the supply node of the grounding voltage VSS.

In this case, an inverting signal /SLP1 of the control signal SLP1 is supplied to a gate electrode of the transistor 55, and an inverting signal /SLP2 of the control signal SLP2 is supplied to a gate electrode of the transistor 56.

In the semiconductor integrated circuit device according to this modified example, advantageous effect similar to that of the semiconductor integrated circuit device shown in FIG. 8 can be attained.

(Third Embodiment)

Figure 10:
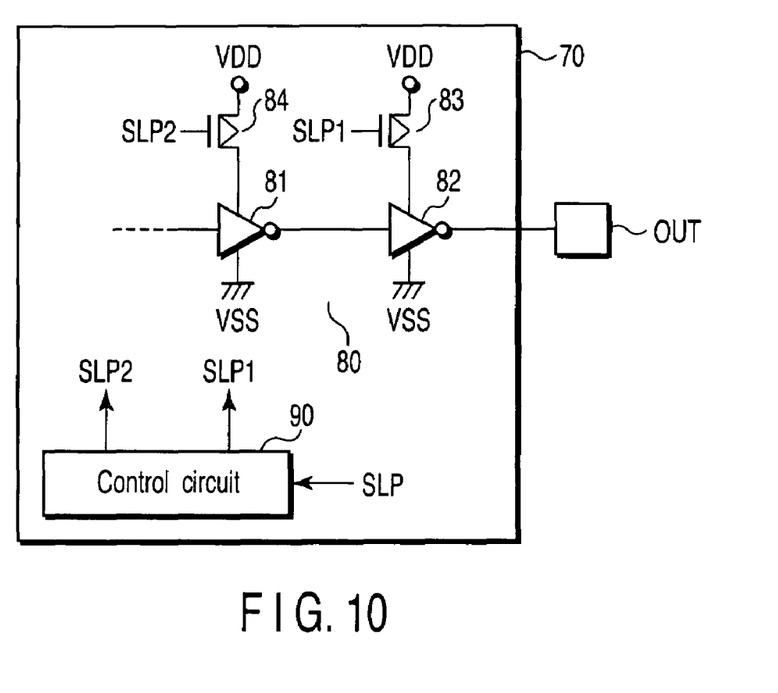
FIG. 10 is a circuit diagram depicting a semiconductor integrated circuit device according to a third embodiment.

FIG. 10 shows a configuration of a semiconductor integrated circuit device according to a third embodiment. In this semiconductor integrated circuit device, an interface circuit 80 and a control circuit 90 which controls an operation of the interface circuit 80 are formed in a semiconductor chip 70.

The interface circuit 80 outputs a signal generated in the semiconductor chip 70 to the outside of the chip, and includes an inverter circuit 81 serving as a pre-buffer and an inverter circuit 81 which serves as a main buffer to which an output signal of the inverter circuit 81 is inputted. An output node of the inverter circuit 82 is connected to an output terminal OUT of the chip. Each of the inverter circuits 81 and 82 is a CMOS type circuit composed of a P-channel MOS transistor and an N-channel MOS transistor.

Since an output signal of the inverter circuit 82 drives the output terminal OUT and a wire connected to the output terminal, it is necessary to supply a greater current to the inverter circuit 82 as compared with that to be supplied to the inverter circuit 81. Thus, as is the case with the inverter circuits 14 and 15 shown in FIG. 3, at least the element size at the P-channel side from among the P-channel and N-channel MOS transistors contained in the inverter circuits 81 and 82 is greater at the side of the inverter circuit 82 than that at the inverter circuit 81. Of course, with respect to the element size at the N-channel side as well, the size at the side of the inverter circuit 82 may be greater than that at the side of the inverter circuit 81.

A source to drain of a P-channel MOS transistor 83 is inserted between a power supply node of the inverter circuit 82, namely, a source at the P-channel MOS transistor side in the inverter circuit, and a supply node of the power source voltage VDD. A source to drain of a P-channel MOS transistor 84 is inserted between a power supply node of the inverter circuit 81, namely, a source at the P-channel MOS transistor side in the inverter circuit, and a supply node of the power source voltage VDD. A control signal SLP1 is supplied to a gate electrode of the transistor 83, and a control signal SLP2 is supplied to a gate electrode of the transistor 84.

The control circuit 90 generates the control signals SLP1 and SLP2 in response to a sleep control signal SLP, and has a circuit configuration similar to the control circuit 20 shown in FIG. 3.

An operation of the semiconductor integrated circuit device configured above is similar to that of the interface circuit 50 shown in FIG. 8, and advantageous effect similar to that of the interface circuit 50 shown in FIG. 8 can be attained.

(Modified Example of Third Embodiment)

Figure 11:
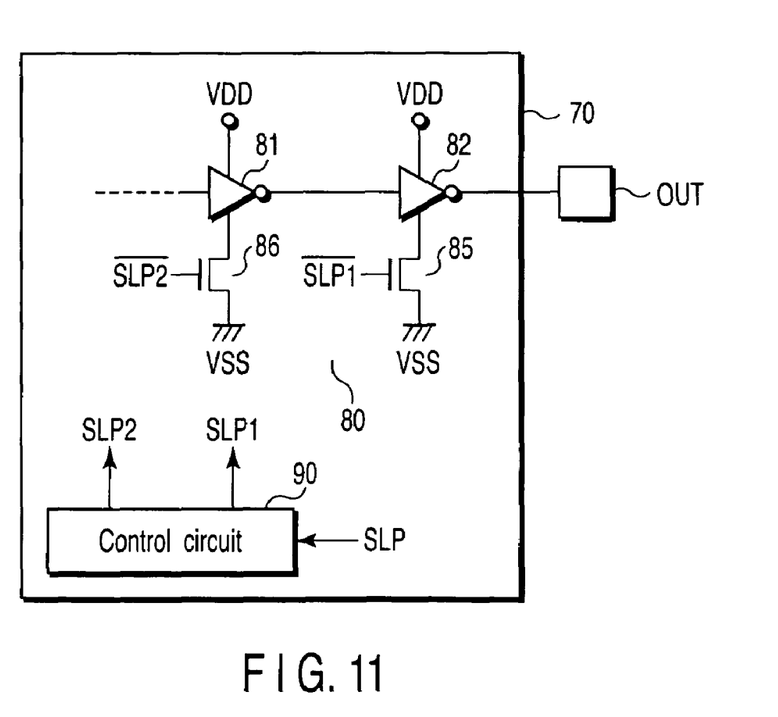
FIG. 11 is a circuit diagram depicting a semiconductor integrated circuit device according to a modified example of the third embodiment.

FIG. 11 shows a configuration of a semiconductor integrated circuit device according to a modified example of the third embodiment. In the semiconductor integrated circuit device shown in FIG. 10, the P-channel MOS transistors 83 and 84 are provided as switches which controls supply/shut off of power source voltage to the two inverter circuits 82 and 81 which configure the interface circuit 80. In contrast, in the semiconductor integrated circuit device shown in FIG. 11, N-channel MOS transistors 85 and 86 are provided as switches which correspond to the P-channel MOS transistors 83 and 84.

That is, a source to drain of one transistor 85 is inserted between a power supply node at the grounding voltage side of the inverter circuit 82, namely, a source at the N-channel MOS transistor side in the inverter circuit, and a supply node of the grounding voltage VSS. A source to drain of the other transistor 86 is inserted between a power supply node at the grounding voltage side of the inverter circuit 81, namely, a source at the N-channel MOS transistor side in the inverter circuit, and a supply node of the grounding voltage VSS.

In this case, an inverting signal /SLP1 of the control signal SLP1 is supplied to a gate electrode of the transistor 85, and an inverting signal /SLP2 of the control signal SLP2 is supplied to a gate electrode of the transistor 86.

Also in the semiconductor integrated circuit device according to this modified example, advantageous effect similar to that of the semiconductor integrated circuit device according to the third embodiment shown in FIG. 10 can be attained.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A MOS type semiconductor integrated circuit device, comprising:
   a plurality of MOS type circuits, each of which has at least one P-channel MOS transistor and one N-channel MOS transistor and has a power supply node, the MOS type circuits being connected in a multistage manner that an output signal at a front stage is supplied as an input signal at a rear stage;
   a first switch element inserted between a first power voltage node and a power supply node of each of MOS type circuits at an odd numbered stage viewed from a final stage from among said plurality of MOS type circuits;
   a second switch element inserted between the first power voltage node and a power supply node of each of MOS type circuits at an even numbered stage viewed from the final stage from among said plurality of MOS type circuits; and
   a control circuit connected to the first and second switch elements to control the first and second switch elements, the control circuit first making the second switch element conductive, and then, making the first switch element conductive when said plurality of MOS type circuits, each of which is established in a standby state, are recovered from the standby state to an active state.

2. The device according to claim 1, wherein, when said plurality of MOS type circuits are changed from an active state to a standby state, the control circuit first makes the first switch element nonconductive, and then makes the second switch element nonconductive.

3. The device according to claim 1, wherein the first and second MOS transistors are P-channel MOS transistors, and the first power source voltage node is a power source voltage node at a high voltage side.

4. The device according to claim 1, wherein the first and second MOS transistors are N-channel MOS transistors, and the first power source voltage node is a power source voltage node at a low voltage side.

5. The device according to claim 1, wherein an element size of at least the P-channel MOS transistor in a MOS type circuit at the final stage from among said plurality of MOS type circuits is greater than that of the P-channel MOS transistor in a MOS type circuit other than that at the final stage.

6. A MOS type semiconductor integrated circuit device, comprising:
   a word line to which a plurality of memory cells are connected;
   a drive circuit connected to the word line to drive the word line; and
   a first control circuit connected to the drive circuit to control an operation of the drive circuit,
   wherein the drive circuit has:
   a plurality of MOS type circuits, each of which has at least one P-channel MOS transistor and one N-channel MOS transistor and has a power supply node, the MOS type circuits being connected in a multistage manner that an output signal at a front stage is supplied as an input signal to a rear stage;
   a first switch element inserted between a first power source voltage node and a power supply node of each of MOS type circuits at an odd numbered stage viewed from a final stage from among said plurality of MOS type circuits; and
   a second switch element inserted between the first power source voltage node and a power supply node of each of MOS type circuits at an even numbered stage viewed from the final stage from among said plurality of MOS type circuits, and
   the first control circuit first makes the second switch element conductive, and then, makes the first switch element conductive when said plurality of MOS type circuits, each of which is established in a standby state, are recovered from the standby state to an active state.

7. The device according to claim 6, wherein, when said plurality of MOS type circuits are changed from an active state to a standby state, the first control circuit first makes the first switch element nonconductive, and then makes the second switch element nonconductive.

8. The device according to claim 6, further comprising a second control circuit which, when the standby state is established, sets a logic level of an input signal of the drive circuit that an output signal of the drive circuit is set at a low level.

9. The device according to claim 6, further comprising a third switch element inserted between the word line and a second power source voltage node, the third switch element being controlled to be conductive in the standby state.

10. The device according to claim 6, wherein the first and second MOS transistors are P-channel MOS transistors, and the first power source voltage node is a power source voltage node at a high voltage side.

11. The device according to claim 6, wherein the first and second MOS transistors are N-channel MOS transistors, and the first power source voltage node is a power source voltage node at a low voltage side.

12. A MOS type semiconductor integrated circuit device, comprising:
   an interface circuit which outputs a signal from an output terminal; and
   a control circuit connected to the interface circuit to control an operation of the interface circuit,
   wherein the interface circuit has:
   a first MOS type circuit having P-channel and N-channel MOS transistors and having a power supply node, an output node of the first MOS type circuit being connected to an output terminal of the interface circuit;
   a second MOS type circuit having P-channel and N-channel MOS transistors and having a power supply node, the second MOS type circuit inputting an output signal to the first MOS type circuit;
   a first switch element inserted between the power supply node of the first MOS type circuit and a first power source voltage node; and
   a second switch element inserted between the power supply node of the second MOS type circuit and the first power source voltage node, and
   the control circuit first makes the second switch element conductive, and then makes the first switch element conductive when the first and second MOS type circuits, each of which is established in a standby state, are recovered from the standby state to an active state.

13. The device according to claim 12, wherein the interface circuit is provided in each of a plurality of IP blocks contained in a semiconductor chip.

14. The device according to claim 13, further comprising a plurality of internal wires which connect said plurality of IP blocks.

15. The device according to claim 12, wherein the interface circuit is provided in a semiconductor chip, and the interface circuit outputs a signal generated in the semiconductor chip to the outside of the chip.

16. The device according to claim 12, wherein, when the first and second MOS type circuits are changed from an active state to a standby state, the control circuit first makes the first switch element nonconductive, and then makes the second switch element nonconductive.

17. The device according to claim 12, wherein the first and second MOS transistors are P-channel MOS transistors, and the first power source voltage node is a power source voltage node at a high voltage side.

18. The device according to claim 12, wherein the first and second MOS transistors are N-channel MOS transistors, and the first power source voltage node is a power source voltage node at a low voltage side.

19. The device according to claim 12, wherein an element size at least the P-channel MOS transistor in the first MOS type circuit is greater than that of the P-channel MOS transistor in the second MOS type circuit.

* * * * *

UNITED STATES PATENT AND TRADEMARK OFFICE
CERTIFICATE OF CORRECTION

| | | |
|---|---|---|
| PATENT NO. | : 7,215,178 B2 | Page 1 of 1 |
| APPLICATION NO. | : 11/251824 | |
| DATED | : May 8, 2007 | |
| INVENTOR(S) | : Kushida et al. | |

It is certified that error appears in the above-identified patent and that said Letters Patent is hereby corrected as shown below:

On the title page, Item (30), the Foreign Application Priority Data has been omitted. Item (30) should read:

-- (30)     Foreign Application Priority Data

Dec. 20, 2004  (JP) ......................... 2004-368209 --

Signed and Sealed this

Third Day of July, 2007

JON W. DUDAS
*Director of the United States Patent and Trademark Office*